(12) United States Patent
Koepp et al.

(10) Patent No.: US 9,997,608 B2
(45) Date of Patent: Jun. 12, 2018

(54) TRANSISTOR DEVICE WITH SEGMENTED CONTACT LAYER

(71) Applicant: Infineon Technologies AG, Neubiberg (DE)

(72) Inventors: Karoline Koepp, Munich (DE); Herbert Gietler, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/404,285

(22) Filed: Jan. 12, 2017

(65) Prior Publication Data

US 2017/0200795 A1    Jul. 13, 2017

(30) Foreign Application Priority Data

Jan. 13, 2016    (DE) .................. 10 2016 100 504

(51) Int. Cl.
*H01L 29/423*    (2006.01)
*H01L 29/40*    (2006.01)
*H01L 29/417*    (2006.01)
*H01L 29/78*    (2006.01)
*H01L 29/06*    (2006.01)

(52) U.S. Cl.
CPC ...... *H01L 29/4238* (2013.01); *H01L 29/0696* (2013.01); *H01L 29/40* (2013.01); *H01L 29/401* (2013.01); *H01L 29/41725* (2013.01); *H01L 29/41741* (2013.01); *H01L 29/7813* (2013.01)

(58) Field of Classification Search
CPC . H01L 29/41725; H01L 29/40; H01L 29/401; H01L 29/4238
See application file for complete search history.

(56) References Cited

U.S. PATENT DOCUMENTS

| 3,474,303 | A | 10/1969 | Lutz |
| 6,184,092 | B1* | 2/2001 | Tseng ............... 438/272 |
| 6,470,803 | B1* | 10/2002 | Liu ............... F42D 1/05 102/206 |
| 2001/0051420 | A1* | 12/2001 | Besser ............... H01L 21/76802 438/597 |
| 2005/0167849 | A1* | 8/2005 | Sato ............... H01L 23/4334 257/778 |
| 2009/0218621 | A1* | 9/2009 | Pfirsch ............... H01L 29/0634 257/342 |

(Continued)

FOREIGN PATENT DOCUMENTS

DE    19908205 C1    4/2000

OTHER PUBLICATIONS

Pavelescu et al (1992), "1 MHz dielectric constants of phosphosilicate glass films chemically vapour-deposited in the SiH4—PH3—O2—N2 system at low temperature", Journal of Materials Science, 27, 2631-2635.*

*Primary Examiner* — Fei Fei Yeung Lopez
(74) *Attorney, Agent, or Firm* — Murphy, Bilak & Homiller, PLLC

(57) ABSTRACT

Disclosed is a transistor device. The transistor device includes a plurality of device cells each having an active device region integrated in a semiconductor body and electrically connected to a contact layer. The contact layer includes a plurality of layer sections separated from each other by a separation layer. A resistivity of the separation layer is at least 100 times the resistivity of the layer sections.

20 Claims, 5 Drawing Sheets

(56) References Cited

U.S. PATENT DOCUMENTS

2012/0146133 A1* 6/2012 Hirler ............... H01L 21/76898
  257/330
2014/0002666 A1* 1/2014 Eden ..................... G01J 5/0803
  348/164
2016/0126349 A1   5/2016 Edwards

* cited by examiner

TRANSISTOR DEVICE WITH SEGMENTED CONTACT LAYER

TECHNICAL FIELD

This disclosure relates to a transistor device with a contact layer.

BACKGROUND

Transistor devices such as field-effect controlled transistor devices are widely used as electronic switches or active rectifier elements in automotive, industrial, or consumer electronic applications. Such transistor devices, which are often referred to as power transistor devices, include a plurality of device cells (transistor cells) that are connected in parallel by having gate nodes of the individual device cells connected to a common gate node, by having drain nodes of the individual device cells connected to a common drain node, and by having source nodes of the individual device cells connected to a common source node.

In such a transistor device the common source node can be formed by a contact layer (metallization layer). This contact layer can be soldered to an electrode layer, which may be part of an electrical connector, a printed circuit board (PCB), or the like. Soldering the contact layer to the electrode layer includes forming a solder layer on the contact layer, wherein the solder layer electrically connects the contact layer with the electrode layer. This solder layer may include voids. Those voids locally increase the electrical resistance between and the thermal resistance between the contact layer and the electrode layer. A local increase of the thermal resistance may cause the transistor device to overheat in regions below the void.

There is therefore a need for a transistor device that is robust against imperfections, such as voids, of a solder layer.

SUMMARY

One example relates to a transistor device. The transistor device includes a plurality of device cells each having an active device region integrated in a semiconductor body and electrically connected to a contact layer. The contact layer includes a plurality of layer sections separated from each other by a separation layer, wherein a resistivity of the separation layer is at least 100 times the resistivity of the layer sections.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
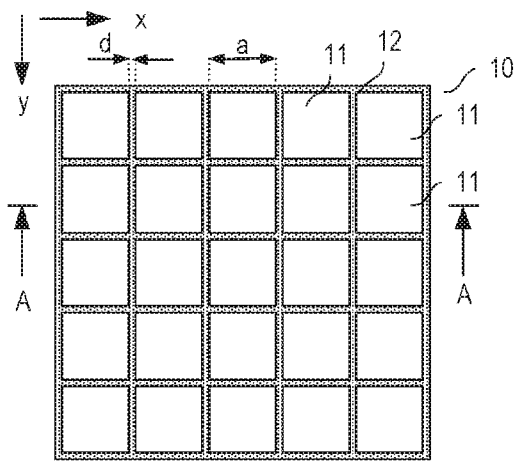
FIG. 1 shows a top view of one section of a contact layer that includes a plurality of separate layer sections.

FIG. 1 shows a top view of a contact layer 10 of a semiconductor device, in particular, a semiconductor device that includes a plurality of device cells. Referring to FIG. 1, the contact layer 10 includes a plurality of separate layer sections (segments) 11. These layer sections 11 are separated from each other by a separation layer 12. That is, neighboring layer sections 11 are spaced apart and separated from each other by the separation layer 12.

The electrode segments 11 are electrically conducting. According to one example, the electrode segments 11 include a metal, a metal alloy, or a metal compound. Examples of a metal include copper (Cu), aluminum (Al), titanium (Ti), platinum (Pt), gold (Au), and tungsten (W). Examples of a metal alloy include aluminum copper (AlCu), copper nickel (CuNi), or the like. Examples of metal compounds include silicides, such as titanium silicide (TiSi), tungsten silicide (WSi), or the like. According to one example, the material of the layer sections 11 is selected to have a resistivity $\rho_{11}$ of below 1E-6 Ω·m, below 5E-6 Ω·m, below 1E-7 Ω·m, or even below 5E-8 Ω·m. According to one example, the separation layer is electrically conducting and the electrical resistivity (at room temperature, 20° C.) $\rho_{12}$ of the separation layer 12 is several orders of magnitude higher than the resistivity $\rho_{11}$ of the layer sections 11, that is, $\rho_{12} \gg \rho_{11}$. For example, the electrical resistivity $\rho_{12}$ of the separation layer 12 is more than 1E2 times, more than 1E3 times, more than 1E4 times, or even more than 1E6 times the resistivity $\rho_{11}$ of the layer sections 11.

According to one example, the separation layer 12 is not electrically conducting but is semiconducting or electrically insulating. According to one example, the resistivity (at room temperature) is higher than 1E2 Ω·m, higher than 1E6 Ω·m, higher than 1E10 Ω·m, or even higher than 1E12 Ω·m. According to one example, the separation layer 12 includes a polymer, a semiconductor oxide, such as silicon oxide (SiO$_2$), a metal oxide, or the like.

According to one example, the individual layer sections 11 have substantially the same shape. For example, these layer sections 11 are rectangular, in particular, square. In the example shown in FIG. 1, the layer sections 11 are square, wherein 'a' denotes an edge length of these square layer sections 11. According to one example, the individual layer sections 11 have substantially the same size and 'a' is selected from between 20 micrometers and 200 micrometers. In FIG. 1, d denotes a distance between neighboring layer sections 11. According to one example, d is the distance between neighboring layer sections in a first lateral direction x and in a second lateral direction y. According to one example, the layer sections are equally spaced in the first lateral direction x and the second lateral direction y and the distance d is selected from between 1 micrometer and 20 micrometers.

According to one example, the size (area.) of the layer sections 11 and the distance between neighboring layer sections 11 are adapted to one another such that an overall size (area) of the separation layer 12 is less than 40%, less than 20%, or even less than 5% of an overall size (area) of the layer sections 11. The overall area of the layer sections 11 is the sum the sizes of the individual layer sections 11, wherein in the example shown in FIG. 1, the size of each layer sections equals a$^2$.

FIG. 1 shows one section of the contact layer 10. According to one example, the contact layer 10 includes more than 100, more than 250, more than 500, or even more than 1000 layer sections 11.

Figure 2:
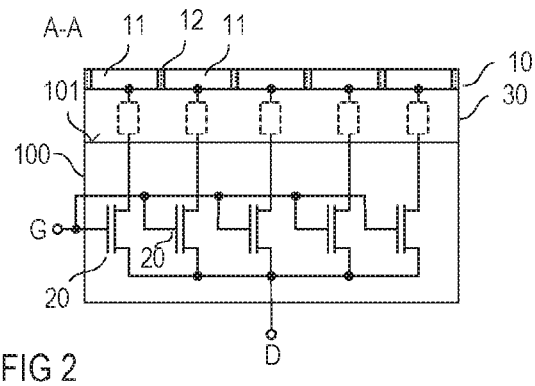
FIG. 2 shows a vertical cross sectional view of one section of a transistor device that includes a contact layer of the type shown in FIG. 1.

FIG. 2 shows a vertical cross sectional view of one section of a transistor device that includes a contact layer 10 of the type shown in FIG. 1. The semiconductor device includes a semiconductor body 100 with a first surface 101. The contact layer 10 is arranged above the first surface 101 and is substantially parallel to the first surface 101. The semiconductor device illustrated in FIG. 2 is a transistor device and includes a plurality of device cells (transistor cells). These transistor cells are only schematically illustrated in FIG. 2 by circuit symbols of transistors, in particular field-effect transistors (FETs). Each of the transistor symbols 20 shown in FIG. 2 represents at least one transistor cell. That is, each of these circuit symbols represents one transistor cell or represents a group of parallel connected transistor cells. One example of how these transistor cells can be implemented and connected in parallel is explained with reference to FIG. 5 below.

According to one example, there is a plurality of groups of transistor cells and each of these groups of transistor cells is associated with a respective one of the plurality of layer sections 11. Each group of transistor cells is electrically connected to the associated layer sections 11. In particular, source regions of the transistor cells of one group are electrically connected to the layer section 11 associated with the respective group of transistor cells. This is illustrated in FIG. 2 in that the transistor symbols representing one group of transistor cells are drawn to have their source node connected to the respective layer section 11. Optionally, the transistor device includes a connection arrangement between the semiconductor body 100 and the electrode layer 11. The connection arrangement connects each of the individual groups of transistor cells to the respective layer section 11. This connection arrangement 30 is represented by resistors (illustrated in dashed lines) connected between the groups of transistor cells (represented by the transistor symbols) and the respective layer sections 11.

According to one example, each group of transistor cells is exclusively connected to a respective one of the plurality of layer sections 11. In the following, "a group of transistor cells being connected to one layer section 11" means that the transistor cells of the group of transistor cells are directly connected to the respective layer section 11. "Directly connected" means that the transistor cells are electrically connected to the respective layer section 11 either directly or via the optional connection arrangement 30, but not via the separation layer 12.

The transistor cells of the transistor device have their gate electrodes electrically connected to a common gate node G and have their drain regions electrically connected to a common drain node D. This is shown in FIG. 2 by the transistor symbols being drawn to have the gate nodes connected to the common gate node G and the drain nodes connected to the common drain node D.

Figure 3A:
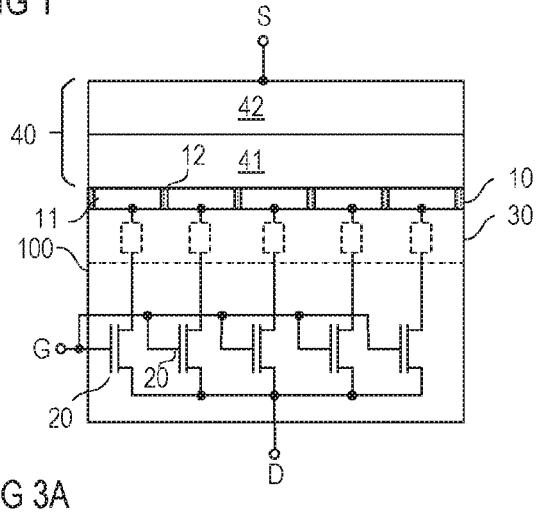
FIG. 3A shows a vertical cross sectional view of a transistor device of the type shown in FIG. 2 that includes a solder layer on the contact layer and an electrode layer on the solder layer.

Referring to FIG. 3A, which shows a vertical cross sectional view of a transistor device of the type shown in FIG. 2, the contact layer 10 can be configured to have a solder layer 41 disposed thereon. This solder layer 41 serves to electrically and thermally connect the contact layer 10 to another electrically conducting layer or contact electrode, respectively. This other electrically conducting layer can be a layer on a printed circuit board (PCB), can be part of an electrical connector, or the like. In the following, the contact layer 10 is referred to as first contact layer or segmented contact layer, and the contact layer 42 is referred to as second contact layer or electrode layer. The second contact layer 42, which is electrically connected to the layer sections 11 via the solder layer 41 and, therefore, to the source regions of the individual transistor cells implemented in the semiconductor body 100, forms a source node S of the overall transistor device. This source node S is schematically illustrated in FIG. 3A.

Figure 3B:
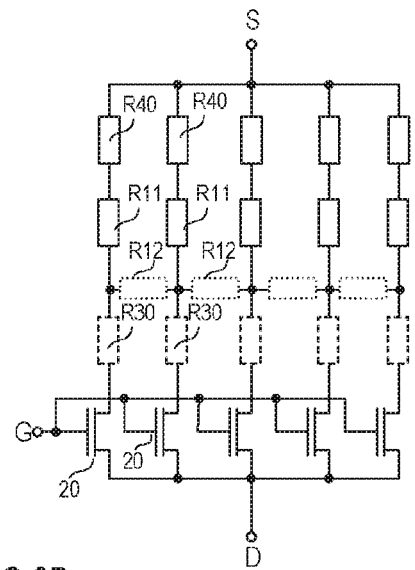
FIG. 3B shows an equivalent circuit diagram of the transistor device shown in FIG. 3A.

FIG. 3B shows the equivalent circuit diagram of the arrangement with the transistor device, the solder layer 41 and the electrode layer 42 shown in FIG. 3A. This equivalent circuit diagram includes a plurality of transistors 20, with each of these transistor 20 representing a group of transistor cells as explained with reference to FIG. 2 above. Furthermore, the equivalent circuit diagram includes a plurality of series circuits, with each of these series circuits including a load path (drain-source path) of one of the plurality of transistors 20, an optional resistor R30, a resistor R11, and a resistor R40. Each of the resistors R11 represents the electrical resistance of one of the plurality of layer sections 11, and each of the resistors R40 represents the electrical resistance of the solder layer 41 and the electrode layer 42 between a respective one of the layer sections 11 and the source node S. Each of the resistors R30 represents the electrical resistance of the optional connection arrangement, between one group of transistor cells and the respective layer section 11 in case they are not connected directly. The series circuits explained before are connected in parallel between the source node S and the drain node D. The gate electrodes of the individual transistor cells represented by the transistors 20 shown in FIG. 3B are electrically connected to the common gate node G in the way explained herein before. Optionally, the equivalent circuit diagram includes resistors R12 (illustrated in dotted lines in FIG. 3B), wherein each of these resistors R12 is connected between two of the resistors R11 representing the resistance of the layer sections 11. These resistors R12, which are referred to as crosslink resistors in the following, exist depending on how the separation layer 12 is implemented. If the separation layer 12 is implemented to be electrically conducting (but with a higher resistivity than the layer sections 11) those resistors exist. If, however, the separation layer 12 is implemented to be electrically insulating, these resistors R12 do not exist (or have such a high electrical resistance that a current flow through these resistors R12 can be neglected).

Figure 4A:
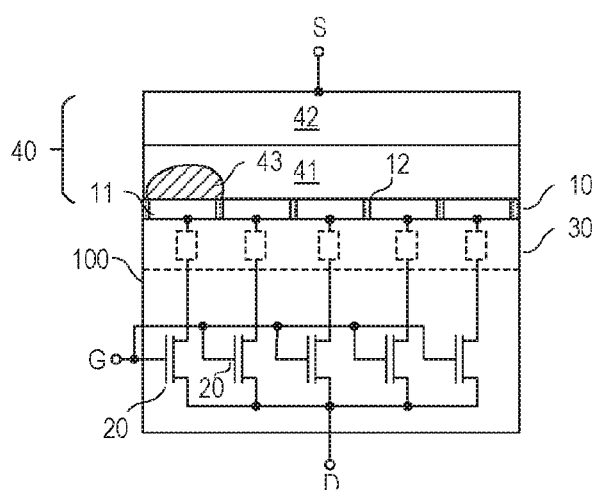
FIG. 4A shows a transistor device of the type shown in FIG. 3A in which the solder layer includes a void.
Figure 4B:
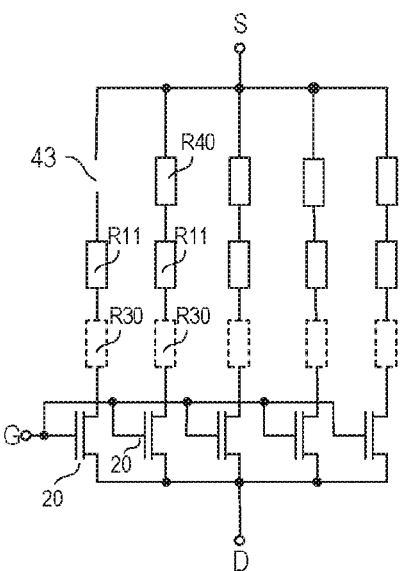
FIG. 4B shows the equivalent circuit diagram of the transistor device shown in FIG. 4A.

The functionality of the segmented contact layer 10 is explained with reference to FIGS. 4A and 4B. FIG. 4A shows an arrangement of the type shown in FIG. 3A, and FIG. 4B shows the equivalent circuit diagram of the arrangement shown in FIG. 4A. For the purpose of explanation it is assumed that the solder layer 41 includes voids in a region where it adjoins the segmented contact layer 10. Those voids may result when the contact layer 10 is not sufficiently wetted before the solder layer 41 is applied. Such insufficient wetting may occur when there is contamination on the contact layer 10. One such void 43 is schematically shown in FIG. 4A. For the purpose of explanation it is further assumed that a position and a size of the void 43 is such that the void 43 completely separates one of the plurality of layer sections 11 from the solder layer 41. With other words, the void 43 interrupts an electrical connection between the respective layer section 11 and the solder layer 41, therefore, between the respective layer section 11 and the source node S. This is illustrated in the equivalent circuit diagram shown in FIG. 4B by a broken line between the source node S and the resistor R11 in one of the series circuits. For the purpose of explanation it is assumed that the separation layer 12 is electrically insulating, so that there are no cross link resistors shown in the equivalent circuit diagram shown in FIG. 4B.

In the example shown in FIGS. 4A and 4B, the void 43 prevents a current to flow between the drain node D and the source node S via the layer section 11 affected by the void 43 and the group of transistor cells connected to this layer section 11, when the transistor device is in the on-state. The transistor device is in the on-state, when a voltage (gate-source voltage) is applied between the gate node G and the source node S such that the individual transistor cells have an electrically conducting path between their internal source region and internal drain region.

By virtue of the segmentation of the contact layer 10, those transistor cells, that are connected to the layer section 11 affected by the void 43 do not conduct a current. This is particularly beneficial in those cases in which the transistor cells are integrated in the semiconductor body 100 below their respective layer section 11 they are connected to. When the transistor cells conduct a current, losses occur. These losses cause the semiconductor body 100 to be heated, wherein the heat is dissipated via the segmented contact layer 10, the solder layer 41 and the second electrode layer 42. A void, such as a void 43 shown in FIG. 4A, not only increases an electrical resistance between a layer section 11 and the solder layer 41 (or even interrupts an electrical connection between the electrode layer 11 and the solder layer 41) but also increases a thermal resistance between the layer section 11 and the solder layer 41. Segmenting the contact layer 10 has the effect, that those transistor cells that are connected to a layer section 11 completely covered by a void 43 do not conduct a current and, therefore, do not dissipate power. This prevents the semiconductor body 100 from being overheated in those sections that are poorly thermally connected to the solder layer 41 due to a void 43.

If the first contact layer 10 would not be segmented, a current from transistor cells that are integrated in the semiconductor body 100 below the void 43 could bypass the void by flowing laterally in the layer section 10, so that these transistor cells dissipate power like the other transistor cells not arranged below a void. The void, however, impedes the dissipation of heat from semiconductor regions below the void 43 so that those semiconductor regions tend to be overheated, so that the semiconductor device may be damaged or even destroyed in those semiconductor regions.

Figure 5:
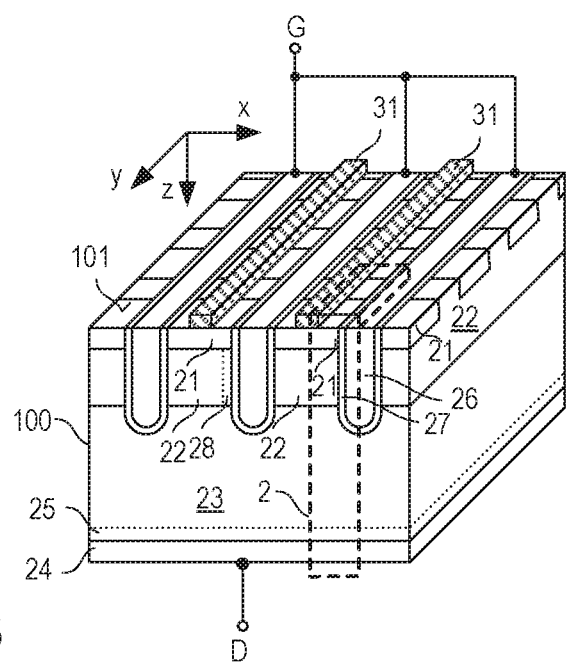
FIG. 5 shows a perspective sectional view of one section of a semiconductor body in which active regions of a plurality of transistor cells are integrated.

In case the separation layer 12 is not electrically insulating, but is electrically conducting and has a higher electrical resistivity than the layer sections 11, a current may flow in the contact layer 10 coming from those transistor cells that are arranged below the void 43. By virtue of the higher resistivity of the separation layer 12, however, the current through those transistor cells arranged below the void 43 is lower than the current through the other transistor cells not arranged below a void. By this, the transistor cells arranged below the void 43 dissipate less power than other transistor cells so that the poorer thermal connection to the solder layer 41 of those sections of the semiconductor body 100 that are below the void 43 is less critical. FIG. 5 illustrates one example of how a plurality of transistor cells can be integrated in the semiconductor body 100.

FIG. 5 shows a perspective sectional view of one section of the semiconductor body 100. In this section shown in FIG. 5, a plurality of transistor cells are integrated. One of these transistor cells is labeled with reference character 2, and the outline of this transistor cell is illustrated in dashed lines. Referring to FIG. 5, each of the plurality of transistor cells includes a source region 21, a body region 22 and a drift region 23. The body region 22 separates the source region 21 from the drift region 23. The drift region 23 is arranged between the body region 22 and a drain region 24. Optionally, a field-stop region 25 (illustrated in dashed lines in FIG. 5) is arranged between the drift region 23 and the drain region 24. The field-stop region 25 has the same doping type as the drift region 23, but is more highly doped. Furthermore, each transistor cell 2 includes a gate electrode 26 adjacent the body region 22 and dielectrically insulated from the body region 22 by a gate dielectric 27.

The transistor device shown in FIG. 5 is a vertical transistor device. That is, the source region 21 and the drain region 24 of each transistor cell 2 are spaced apart from each other in a vertical direction z of the semiconductor body 100. The "vertical direction" is a direction perpendicular to the first surface 101. Furthermore, the gate electrode 26 is implemented as a trench electrode in this example. That is, the gate electrode 26 is located in a trench that extends from the first surface 101 into the semiconductor body 100. This, however, is only an example. The transistor can be implemented with a planar gate electrode, which is a gate electrode located above the first surface 101, as well. Furthermore, several transistor cells share one gate electrode 26 and the corresponding gate dielectric 27. For this, the gate electrode 26 is elongated in the lateral direction v of the semiconductor body 100. Furthermore, two or more transistor cells share one source region 21 in the example shown in FIG. 5, several transistor cells share one body region 22, and all the transistor cells share the drift region 23, the drain region 24 and the optional field-stop region 25. In the example shown in FIG. 5, several gate electrodes 26 are shown. These gate electrodes 26 are electrically connected to the gate node G, wherein connections between the gate electrodes 26 and the gate node G are only schematically illustrated in FIG. 5.

Referring to FIG. 5, each transistor cell 2 further includes a source electrode 31 which is electrically connected to the source region 21 and the body region 22 of the respective transistor cell 2. In this example, the source electrode 31 is arranged above the first surface 101 and adjoins the source region 21 and the body region 22. For this, the body region 22 includes a section that extends to the first surface 101 adjacent the source region 21. According to one example, the body region 22, in those regions where it is connected to the source electrode 31 has a contact region that is more highly doped than remaining regions of the body region 22. However, such contact region is not explicitly shown in FIG. 5. The source region 21 and the body region 22 are ohmically connected to the source electrode 31. In the example shown in FIG. 5, there are several source electrodes 31, and each of these source electrodes 31 is elongated in the lateral direction y and substantially parallel to the gate electrodes 26, so that each of the source electrodes 31 is electrically connected to the source regions 21 and the body regions 22 of several transistor cells 2. Implementing the source electrode 31 to be arranged above the first surface 101 is only an example. According to another example (not shown), the source electrode 31, like the gate electrode 26, is arranged in a trench and extends through the source region 21 into the body region 22. In this embodiment, it is not necessary for the body region 22 to extend to the first surface 101 of the semiconductor body 100.

The transistor device can be implemented as an n-type transistor device or a p-type transistor device. The type of transistor device is dependent on the doping type of the source region 21. In an n-type transistor device, the source region 21 is n-doped, and in a p-type transistor device, the source region 21 is p-doped. The drift region 23 has the same doping type as the source region 21, and the body region 22 has a doping type complementary to the doping type of the source region 21 and the drift region 23, so that a pn-junction is formed between the body region 21 and the drift region 23. The transistor device can be implemented as a MOSFET (Metal Oxide Semiconductor Field-Effect Transistor) or as an IGBT (Insulated Gate Bipolar Transistor). In a MOSFET, the drain region 24 has the same doping type as the source region 21, and in an IGBT, the drain region 24 has a doping type complementary to the doping type for the source region 21. Furthermore, the transistor device can be implemented as an enhancement device (normally-off device) or as a depletion device (normally-on device). In an enhancement device, the body region 22 adjoins the gate dielectric 27. In a depletion device, there is a channel region of the same doping type as the source region 21 and the drift region 23 along the gate dielectric 27 between the body region 22 and the gate dielectric 27. One such channel region 28 is illustrated in dotted lines in FIG. 5.

Figure 6:
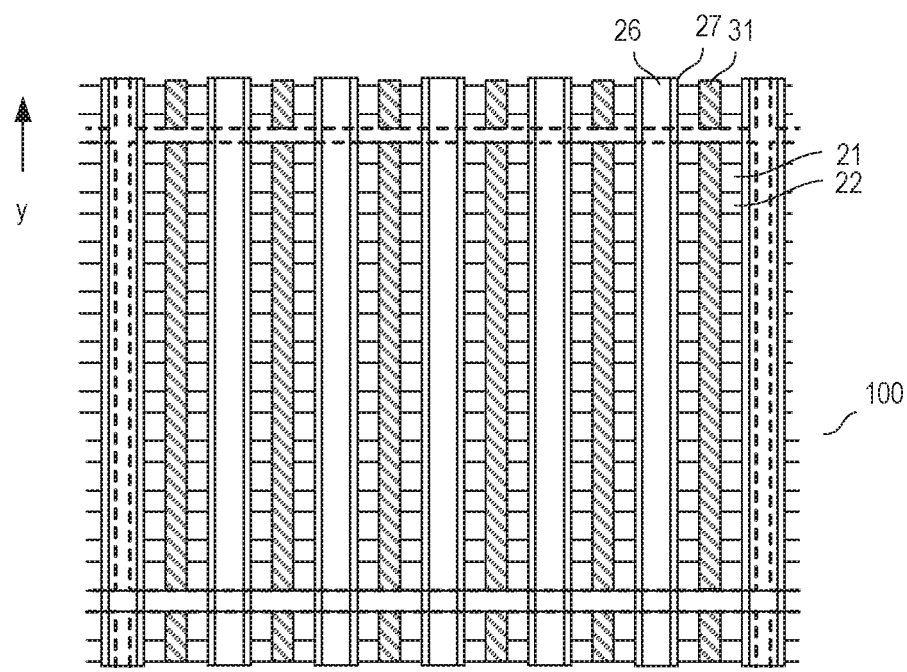
FIG. 6 shows a top view of a semiconductor body that includes a plurality of transistor cells of the type shown in FIG. 5 and that illustrates borders of layer sections arranged above the semiconductor body.

FIG. 6 shows a top view of a semiconductor body 100 in which a plurality of transistor cells of the type shown in FIG. 5 are integrated. Bold dashed lines in FIG. 6 represent the outlines of one layer section 11 and parts of neighboring layer section 11. As can be seen from FIG. 6, the source electrodes 31 are segmented so that each source electrode 31 is only located below one layer section 11, so as to make sure that only transistor cells located below the respective layer section 11 are electrically connected to the respective layer section 11.

Figure 7A:
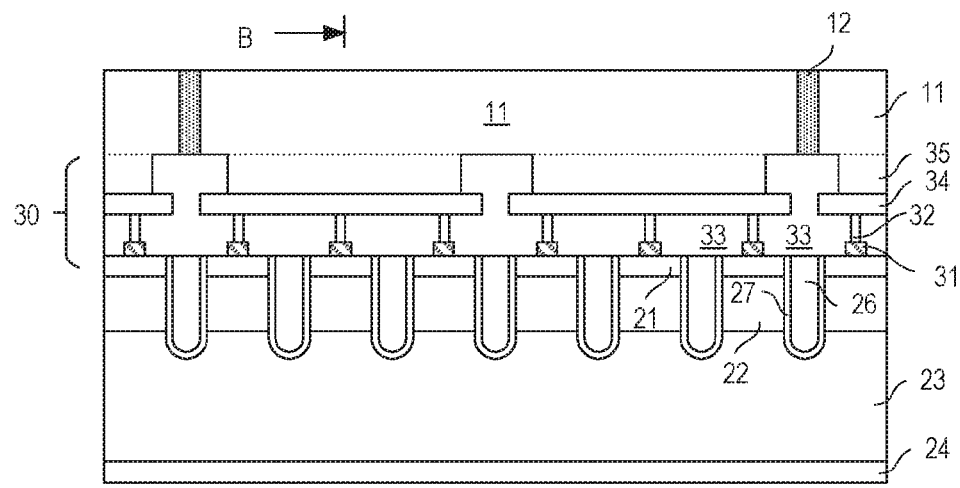
FIG. 7A shows, in a first section plane, a vertical cross sectional view of a transistor device that includes transistor cells of the type shown in FIG. 5.
Figure 7B:
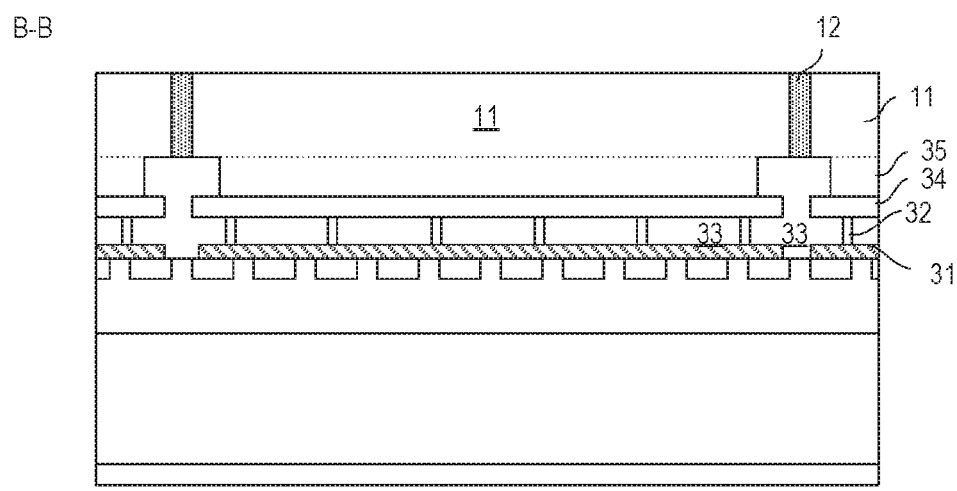
FIG. 7B shows, in a second section plane, a vertical cross sectional view of a transistor device that includes transistor cells of the type shown in FIG. 5.

FIGS. 7A and 7B show one example of how transistor cells located below one layer section 11 can be electrically connected to this layer section 11. The transistor cells shown in FIGS. 7A and 7B are transistor cells of the type explained with reference to FIG. 5. FIG. 7A shows the semiconductor device in a first section plane B-B shown in FIG. 6, and FIG. 7B shows the transistor device in a second section plane C-C shown in FIG. 6. In the example shown in FIGS. 7A and 7B, the transistor cells are electrically connected to the layer section 11 through a connection arrangement 30. The connection arrangement 30 includes an electrically conducting layer 34 with several separate segments. This electrically conducting layer 34 is often referred to as "metal 1" layer. Each segment of this electrically conducting layer 34 is electrically connected to several source electrodes 31 through electrically conducing vias 32. Just for the purpose of illustration, each segment 34 is electrically connected to three source electrodes 31 in the example shown in FIG. 7A. Furthermore, the layer section 11 is electrically connected to at least one of these segments 34 through electrically conducting vias 35. Just for the purpose of illustration, one layer section 11 is electrically connected to two of those segments 34 in the example shown in FIG. 7A. Each of the segments 34 is electrically connected to only one of the plurality of layer sections 11, and each source electrode 31 is electrically connected to only one of the segments 34. By this, each of the transistor cell is connected to only one of the layer sections 11. It should be noted that having connected three source electrodes 31 to one segment and two segments to one layer section is only an example. Of course, more than three source electrodes 31 can be connected to one segment, and more than three segments 34 can be connected to one layer section 11. The number of device cells connected to a respective layer section is given by the number of device cells connected to one source electrode multiplied with the number of source electrodes 31 connected to one segment 34 and multiplied with the number of segments 34 connected to the layer section 11.

Figure 8:
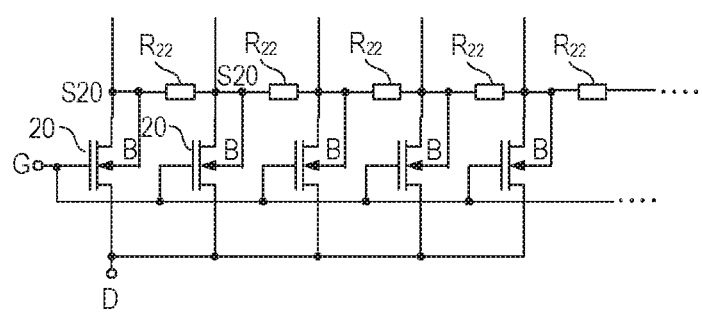
FIG. 8 shows the equivalent circuit diagram of the transistor device shown in FIGS. 7A and 7B.

According to one example, the body regions 22 extend below several layer sections 11 along the gate electrodes 21 so that the transistor cells associated with several different layer sections 11 share one body region 22. An equivalent circuit diagram of a transistor device of this type is shown in FIG. 8. The circuit diagram shown in FIG. 8 is based on the circuit diagram shown in FIG. 2 and includes a plurality of transistors 20 that have a common drain node and a common gate node. Each of these transistors represents one or more transistor cells connected to a common layer section 11. Just for the purpose of illustration, the transistors 20 in FIG. 8 are drawn as n-type transistors, in particular, n-type MOSFETs. This, however, is only an example; p-type MOSFETs may be used as well. Referring to FIGS. 6 and 7A-7B, the transistor cells connected to one layer section 11 have their source regions 21 electrically connected with their body regions 22 by the source electrodes 31. These connections between the source regions 21 and the body regions 22 are represented by an electrical connection between a bulk node B and a source node S20 of the transistors 20 shown in FIG. 20. The bulk node B of each of these transistors 20 represents the body regions 22 of the plurality of transistor cells represented by one transistor 20, and the source node S20 represents the source regions 21 of the plurality of transistor cells represented by one transistor 20.

If one or more body regions 22 extend below several layer sections 11, the source nodes S20 and bulk nodes B, respectively, are connected via resistors $R_{22}$. These resistors are formed by the electrical resistances of those body regions 22 that are common to the transistor cells represented by the transistors 20 shown in FIG. 8. Resistances of these resistors can be increased by increasing a resistance of the body regions, for example, in those regions of the body regions 22 that are below the separation layer 12. Increasing the resistance may include, for example, reducing the doping concentration of the body regions 22, or reducing a cross section of the body region.

Figure 9:
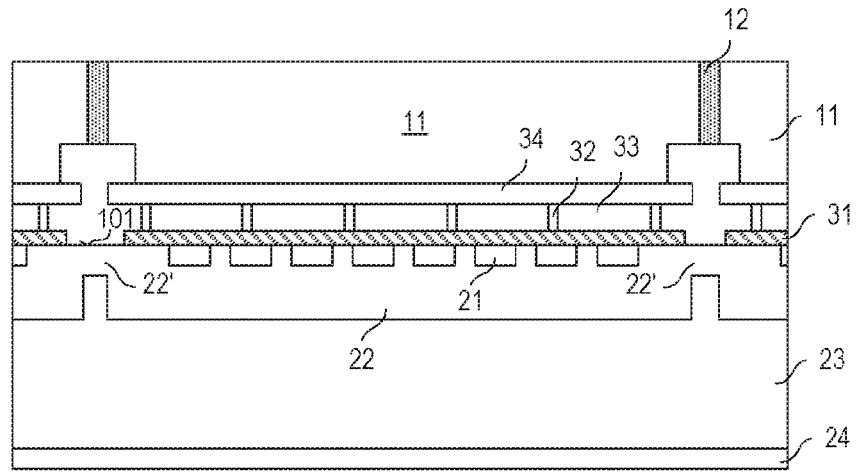
FIG. 9 shows a modification of the transistor device shown in FIG. 7B.

FIG. 9 shows a vertical cross sectional view of a transistor device in which one or more body regions have a reduced cross section in a region below the separation layer 12. In FIG. 9, reference character 22' denotes sections of the body region 22 below the separation layer. In this example, a reduced cross section is obtained in that the shown body region 22 below the separation layer 12 extends less deep into the semiconductor body 100 from the first surface 101 than below the layer section 11.

Figure 10:
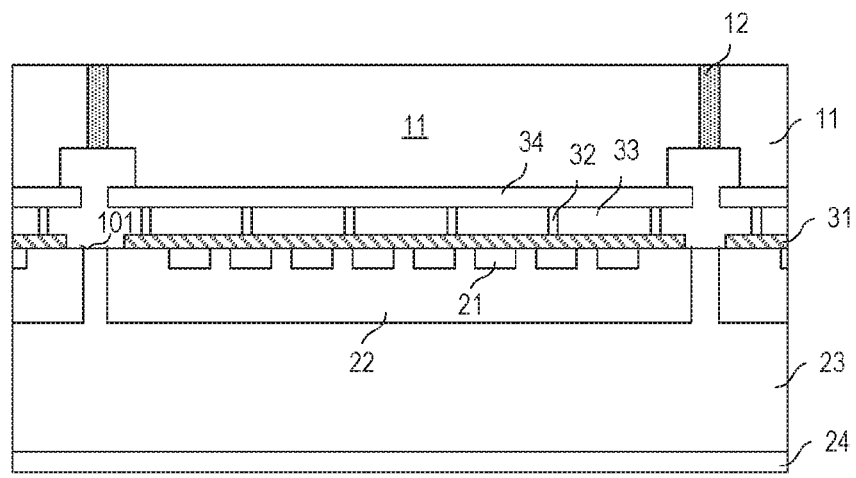
FIG. 10 shows another a modification of the transistor device shown in FIG. 7B.

According to another example, the transistor cells connected to one layer section 11 have a common body region 22 that is separated from body regions of transistor cells connected to other layer sections 11. A vertical cross sectional view of a transistor device of this type is shown in FIG. 10. In this example, in a region below the separation layer 12, the drift region 23 or another doped region (not shown) of a doping type complementary to the doping type of the body region 22 extends to the first surface 101 of the semiconductor body 100 so as to separate the body regions arranged below the individual layer sections from one another.

Figure 11:
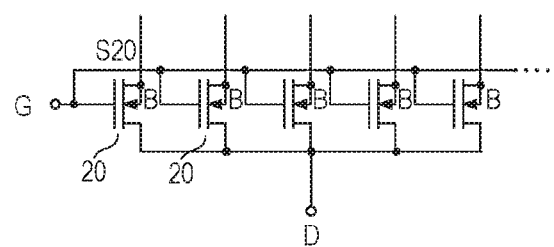
FIG. 11 shows the equivalent circuit diagram of the transistor device shown in FIG. 10.

The equivalent circuit diagram of this transistor device is shown in FIG. 11. In this circuit diagram each of the transistors 20 represents a respective group of transistor cells connected to one layer section 11. Each of these transistors 20 has its bulk node B connected to its source node S20 but not to bulk nodes B and source nodes of other transistors 20.

Figure 12:
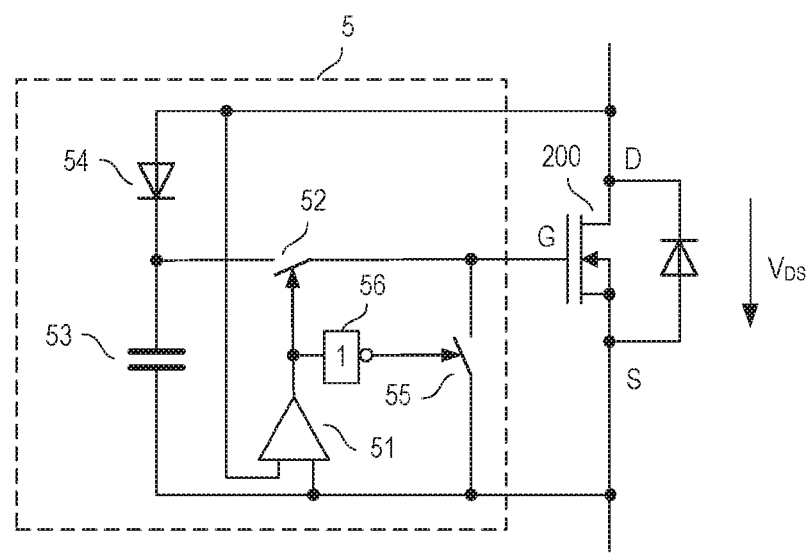
FIG. 12 illustrates one application of a transistor device that includes a contact layer with a plurality of separate layer sections.

According to one example, the transistor device explained herein before is operated as a synchronous rectifier. In this example, there is a drive circuit 5 that detects a polarity of a voltage between the drain node D and the source node S and switches on or switches off the transistor device dependent on the polarity. An equivalent circuit diagram of the transistor device and the drive circuit is shown in FIG. 12. Transistor 200 shown in FIG. 12 represents the transistor device explained before and may be implemented in accordance with any of the examples explained hereinbefore. In particular, this transistor may have an equivalent circuit diagram in accordance with one of FIGS. 8 and 11 explained above. The transistor 200 shown in FIG. 12 is drawn as an n-type MOSFET. This, however, is only an example. A p-type MOSFET may be used as well.

The MOSFET 200 includes an integrated diode, which may be referred to as body diode. This body diode, which is explicitly shown in FIG. 12, is connected between the drain node D and the source node S. The body diode is formed by the pn-junctions between the body regions 21 and the drift regions 23 in the individual transistor cells and by having the source regions 21 and the body regions 22 of the individual transistor cells 2 electrically connected. By virtue of the body diode, the transistor device 200 can conduct a current independent of a drive potential applied to the gate node G, whereas the transistor device conducts a current when a voltage is applied between the drain node D and the source node S that forward biases the body diode.

Referring to FIG. 12, the drive circuit 5 is connected to the gate node G, the source node S and the drain node D. The drive circuit 5 is configured to detect a polarity of a voltage $V_{DS}$ applied between the drain node D and the source node S and to switch on the transistor device when a polarity of the voltage $V_{DS}$ is such that it forward biases the body diode.

In the example shown in FIG. 12, the body diode is forward biased when the voltage $V_{DS}$ between the drain node D and the source node S is negative. When the transistor device 200 switches on it provides an electrically conducting path in parallel with the body diode, thereby realizing a highly efficient rectifier element. The conduction losses are substantially given by $R_{ON} \cdot I_{DS}^2$ when the transistor device 200 is switched on, as opposed to $Vf \cdot I_{DS}$ when the body diode is conducting and the transistor device is switched off, where $R_{ON}$ is the on-resistance of the transistor device, $ID_{DS}$ is the current through the transistor device and Vf is the forward voltage of the body diode. According to one example, the transistor device is designed such that at the rated current $R_{ON} \cdot I_{DS}^2 < Vf \cdot I_{DS}$ so that the efficiency of the rectifier element can be increased by switching on the transistor device 200 when the body diode is forward biased.

One example of how the drive circuit can be implemented is schematically shown in FIG. 12. In this example, the drive circuit includes a detection circuit 51 that is coupled between the node D and the source node S and configured to detect the polarity of the drain-source voltage $V_{DS}$. When the polarity is such that it forward biases the body diode (although the body diode is not necessarily conducting as the voltage level of the drain-source voltage $V_{DS}$ can be below a forward voltage of the body diode) the drive circuit closes a first switch 52 between a voltage source 53 and the gate node G. A series circuit with the first switch 52 and the voltage source 53 is connected between the gate node G and the source node S. When the voltage source 53 is connected to the gate node G it switches on the transistor device 200.

Referring to FIG. 12, the voltage source 53 can be implemented as a capacitor connected in series with a rectifier element 54 (such as a diode). A series circuit with the capacitor 53 and the rectifier element is connected between the drain node D and the source node S. The capacitor 53 is charged via the rectifier element 54 each time the drain-source voltage is such that it reverse biases the body diode and the transistor device 200 is switched off.

Furthermore, the drive circuit 5 is configured to switch off the transistor device 200 when a polarity of the drain-source voltage $V_{DS}$ changes. In this case, the detection circuit 51 switches off the first switch 52 so as to disconnect the voltage source 53 from the gate, and switches on a second switch 55 connected between the gate node G and the source node S. Switching on the second switch 55 discharges an internal gate-source capacitance (not shown) of the transistor device and sets a drive voltage (gate-source voltage) to zero so as to switch off the transistor device. The first switch 52 and the second switch 55 are driven complementary. This is illustrated in FIG. 12 by having the first switch 52 driven by an output signal of the detection circuit 51 and by having the second switch 55 driven by an inverted output signal provided by an inverter from the output signal of the detection circuit. This, however, is only an example. Many other examples can be used to complementary drive the first switch 52 and the second switch 55.

According to one example, the drive circuit 5 is integrated in the same semiconductor body 100 as the transistor device. In this case, the gate electrodes of the individual transistor cells are internally connected to the drive circuit 5 inside the semiconductor body 100, so that there is no external gate node of the transistor device. An "external gate node" is a gate node that can be contacted from externally.

The segmented contact layer 10 explained above may be produced by forming a continuous contact layer all over the connection arrangement 30, forming trenches in the continuous contact layer that subdivide the continuous contact layer into the layer segments 11, and filling the trenches with a separation layer material to form the separation layer 12.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
    a plurality of device cells each having an active device region integrated in a semiconductor body and electrically connected to a contact layer,
    wherein the contact layer comprises a plurality of layer sections arranged in a grid layout and separated from each other on all lateral sides by a separation layer,
    wherein the plurality of layer sections is electrically connected to an electrode layer disposed above and covering the plurality of layer sections, and
    wherein a resistivity of the separation layer is at least 100 times the resistivity of the layer sections.

2. The transistor device of claim 1, wherein the layer sections are electrically conducting and the separation layer is electrically insulating.

3. The transistor device of claim 1, wherein the active regions are source regions.

4. The transistor device of claim 1, wherein each of the plurality of layer sections is electrically connected to the active device region of at least one respective device cell.

5. The transistor device of claim 4, wherein the least one respective device cell comprises two or more device cells.

6. The transistor device of claim 1, further comprising:
    a plurality of source electrodes each connected to an active device region of transistors devices of a respective group of device cells,
    wherein each of the layer sections is electrically connected to at least one respective source electrode of the plurality of source electrodes.

7. The transistor device of claim 6, further comprising:
    a plurality of electrically conducting segments arranged between the semiconductor body and the contact layer,
    wherein each of the electrically conducting segments is connected to at least two respective source electrodes, and
    wherein each of the layer sections is connected to at least two respective electrically conducting segments.

8. The transistor device of claim 6, wherein device cells connected to different layer sections share one body region.

9. The transistor device of claim 6, wherein device cells connected to different layer sections have separate body regions.

10. The transistor device of claim 1, wherein each of the plurality of device cells further comprises a gate electrode.

11. The transistor device of claim 10, wherein the gate electrodes of the plurality of device cells are connected to a common gate node.

12. The transistor device of claim 10, further comprising:
    a drive circuit connected to the common gate node,
    wherein the drive circuit is integrated in the semiconductor body.

13. The transistor device of claim 1, wherein the contact layer comprises at least one of a metal, a metal alloy or a metal compound.

14. The transistor device of claim 1, further comprising:
    a solder layer on the contact layer, wherein the electrode layer is arranged on the solder layer.

15. The transistor device of claim 1, wherein the resistivity of the layer sections is below 1E−6 Ω·m.

16. The transistor device of claim 15, wherein the resistivity of the layer sections is below 5E−6 Ω·m.

17. The transistor device of claim 16, wherein the resistivity of the layer sections is below 5E−8 Ω·m.

18. The transistor device of claim 1, wherein the resistivity of the separation layer is higher than 1E2 Ω·m.

19. The transistor device of claim 1, wherein the resistivity of the separation layer is higher than 1E6 Ω·m.

20. The transistor device of claim 1, wherein the resistivity of the separation layer is at least 1000 times the resistivity of the layer sections.

* * * * *